(12) United States Patent
Schulze et al.

(10) Patent No.: US 9,029,243 B2
(45) Date of Patent: May 12, 2015

(54) METHOD FOR PRODUCING A SEMICONDUCTOR DEVICE AND FIELD-EFFECT SEMICONDUCTOR DEVICE

(71) Applicant: Infineon Technologies AG, Neubiberg (DE)

(72) Inventors: Hans-Joachim Schulze, Taufkirchen (DE); Peter Irsigler, Obernberg/Inn (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/646,790

(22) Filed: Oct. 8, 2012

(65) Prior Publication Data

US 2014/0097488 A1   Apr. 10, 2014

(51) Int. Cl.
| | | |
|---|---|---|
| H01L 21/322 | (2006.01) | |
| H01L 29/78 | (2006.01) | |
| H01L 29/06 | (2006.01) | |
| H01L 21/223 | (2006.01) | |
| H01L 29/36 | (2006.01) | |
| H01L 21/265 | (2006.01) | |

(52) U.S. Cl.
CPC ........ *H01L 29/7813* (2013.01); *H01L 21/3221* (2013.01); *H01L 29/0688* (2013.01); *H01L 21/223* (2013.01); *H01L 21/26506* (2013.01); *H01L 29/36* (2013.01); *Y10S 438/974* (2013.01)

(58) Field of Classification Search
CPC ....................................................... C30B 15/16
USPC ......... 438/471, 473, 476, 974; 117/13, 30, 32
See application file for complete search history.

(56) References Cited

U.S. PATENT DOCUMENTS

| | | | |
|---|---|---|---|
| 5,902,135 A | 5/1999 | Schulze | |
| 6,191,009 B1 * | 2/2001 | Tamatsuka et al. | 438/471 |
| 7,759,227 B2 * | 7/2010 | Maeda et al. | 438/471 |
| 2002/0001899 A1 * | 1/2002 | Ito | 438/231 |
| 2005/0130394 A1 * | 6/2005 | Falster | 438/480 |
| 2011/0042791 A1 * | 2/2011 | Schulze et al. | 257/655 |
| 2011/0143526 A1 * | 6/2011 | Sadohara | 438/502 |

* cited by examiner

*Primary Examiner* — Lex Malsawma
*Assistant Examiner* — Gardner W Swan
(74) *Attorney, Agent, or Firm* — Murphy, Bilak & Homiller, PLLC (57) ABSTRACT

A method for producing a semiconductor device is provided. The method includes providing a wafer including a main surface and a silicon layer arranged at the main surface and having a nitrogen concentration of at least about $3*10^{14}$ cm$^{-3}$, and partially out-diffusing nitrogen to reduce the nitrogen concentration at least close to the main surface. Further, a semiconductor device is provided.

17 Claims, 3 Drawing Sheets

METHOD FOR PRODUCING A SEMICONDUCTOR DEVICE AND FIELD-EFFECT SEMICONDUCTOR DEVICE

TECHNICAL FIELD

Embodiments of the present invention relate to a method for producing a semiconductor device having a semiconductor body with a low concentration of crystal originated particles at least in a portion of the semiconductor body, in particular to a method for producing a field-effect semiconductor device, and a field-effect semiconductor device.

BACKGROUND

Semiconductor devices, in particular field-effect controlled switching devices such as a Junction Field Effect Transistor (JFET), a Metal Oxide Semiconductor Field Effect Transistor (MOSFET) and an Insulated Gate Bipolar Transistor (IGBT) have been used for various applications including but not limited to use as switches in power supplies and power converters, electric cars, air-conditioners, and even stereo systems. Such semiconductor devices are typically manufactured on wafer-level. With increasing wafer-size manufacturing costs per chip typically decrease. Larger silicon-wafers, i.e. silicon-wafers with a diameter of at least 12", are currently only available as magnetic Czochralski grown silicon wafers. Silicon-wafers with a diameter of 8" are also available as float zone grown silicon wafers, but are comparatively expensive and may have a comparatively large resistance variation due to striations.

To avoid or at least to reduce concentration and size of unwanted crystal originated particles (COPs) that may facilitate formation generation centers in the wafer resulting in an enhanced leakage current and weakening of later formed gate dielectrics, special conditions of the magnetic Czochralski process may be used during the crystal growing. In particular, the speed of crystal growth (rate of pulling) may be reduced. This increases costs. Furthermore, A-swirls and crystal dislocations may occur at low speed of crystal growth due to an increased concentration of interstitial silicon (Si).

Another possibility for reducing COPs consists in adding nitrogen during the crystal growth. Nitrogen atoms may avoid the agglomeration of vacancies in the Si-lattice and with it the formation of COPs. However, particularly with regard to power semiconductor devices, it is desirable to form n-type doping regions in the wafer by proton implantation. However, proton implantation may activate electrically inactive nitrogen pairs by the transformation of nitrogen pairs into single nitrogen atoms in the silicon wafer which may result in partial compensation of n-type doping, reducing the life-time of charge recombination centers and/or reducing the charge-carrier life-time, because single substitutional nitrogen atoms have a deep energy level in the band-gap of silicon.

Accordingly, there is a need to improve manufacturing of semiconductor devices, in particular of power semiconductor devices.

SUMMARY

According to an embodiment of a method for producing a semiconductor device, the method includes: providing a wafer including a main surface and a silicon layer arranged at the main surface and having a nitrogen concentration of at least about $3*10^{14}$ cm$^{-3}$; and partially out-diffusing nitrogen to reduce the nitrogen concentration of the silicon layer at least close to the main surface.

According to an embodiment of a semiconductor device, the semiconductor device includes a silicon semiconductor body. The silicon semiconductor body has a main surface. A nitrogen concentration which is lower than about $2*10^{14}$ cm$^{-3}$ at least in a first portion of the silicon semiconductor body. The first portion extends from the main surface to a depth of about 50 μm. The nitrogen concentration increases with the distance from the main surface at least in the first portion. A field-effect structure is arranged next to the main surface.

Those skilled in the art will recognize additional features and advantages upon reading the following detailed description, and upon viewing the accompanying drawings.

BRIEF DESCRIPTION OF THE DRAWINGS

The components in the figures are not necessarily to scale, instead emphasis being placed upon illustrating the principles of the invention. Moreover, in the figures, like reference numerals designate corresponding parts. In the drawings.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appending claims. The drawings are not scaled and are for illustrative purposes only. For clarity, the same elements or manufacturing steps have been designated by the same references in the different drawings if not stated otherwise.

The term "horizontal" as used in this specification intends to describe an orientation substantially parallel to a first or main surface of a semiconductor substrate or body. This can be for instance the surface of a wafer or a die.

The term "vertical" as used in this specification intends to describe an orientation which is substantially arranged perpendicular to the first surface, i.e. parallel to the normal direction of the first surface of the semiconductor substrate or body.

In this specification, a second surface of a semiconductor substrate or semiconductor body is considered to be formed by the lower or backside surface while the first surface is considered to be formed by the upper, front or main surface of the semiconductor substrate. The terms "above" and "below" as used in this specification therefore describe a relative location of a structural feature to another structural feature with consideration of this orientation.

The term "crystal originated particle" (COPs) as used in this specification intends to describe a void in the semiconductor material which is typically formed by an agglomeration of vacancies during crystal growth and may include an outer silicon oxide shell. The risk of forming slip lines in the semiconductor substrate typically increases with the concentration and size of the COPs. Furthermore, COPs which are decorated with in-diffusing heavy metals, like e.g. Fe, Cu, Ni, may act as generation centers enhancing the leakage current of the devices. The diameter of the COPs is typically below about 100 nm, more typically below 80 nm.

In this specification, n-doped is referred to as first conductivity type while p-doped is referred to as second conductivity type. Alternatively, the semiconductor devices can be formed with opposite doping relations so that the first conductivity type can be p-doped and the second conductivity type can be n-doped. Furthermore, some Figures illustrate relative doping concentrations by indicating "−" or "+" next to the doping type. For example, "n$^-$" means a doping concentration which is less than the doping concentration of an "n"-doping region while an "n$^+$"-doping region has a larger doping concentration than the "n"-doping region. However, indicating the relative doping concentration does not mean that doping regions of the same relative doping concentration have to have the same absolute doping concentration unless otherwise stated. For example, two different n$^+$-doping regions can have different absolute doping concentrations. The same applies, for example, to an n$^+$-doping and a p$^+$-doping region.

Specific embodiments described in this specification pertain to, without being limited thereto, to semiconductor devices, in particular to field effect semiconductor transistors and manufacturing methods therefor. Within this specification the terms "semiconductor device" and "semiconductor component" are used synonymously. The semiconductor device typically includes a field-effect structure. The field-effect structure may be a MOSFET or an IGBT-structure having a pn-junction forming a body diode between a drift region of the first conductivity type and a body region of the second conductivity type. The semiconductor device is typically a vertical semiconductor device having two load metallizations, for example a source metallization and a drain metallization for a MOSFET, which are arranged opposite to each other and in low resistive contact with a respective contact region. The field-effect structure may also be formed by a JFET-structure.

Typically, the semiconductor device is a power semiconductor device having an active area with, for example, a plurality of IGBT-cells or MOSFET-cells for carrying and/or controlling a load current between the two load metallizations. Furthermore, the power semiconductor device has typically a peripheral area with at least one edge-termination structure at least partially surrounding the active area when seen from above.

The term "power semiconductor device" as used in this specification intends to describe a semiconductor device on a single chip with high voltage and/or high current switching capabilities. In other words, power semiconductor devices are intended for high current, typically in the 10 Ampere to a few kA range. Within this specification the terms "power semiconductor device" and "power semiconductor component" are used synonymously.

The term "field-effect" as used in this specification intends to describe the electric-field mediated formation of a conductive "channel" of a first conductivity type and/or control of conductivity and/or shape of the channel between two regions of the first conductivity type. The conductive channel may be formed and/or controlled in a semiconductor region of a second conductivity type, typically a body region of the second conductivity type, which is arranged between the two regions of the first conductivity type. Due to the field-effect, a unipolar current path through the channel region is formed and/or controlled between a source region or emitter region of the first conductivity type and a drift region of the first conductivity type in a MOSFET-structure and an IGBT-structure, respectively. The drift region may be in contact with a higher doped drain region of the first conductivity type or a higher doped collector region of the second conductivity type, respectively. The drain region or the collector region is in low resistive electric contact with a drain or collector electrode. The source region or emitter region is in low resistive electric contact with a source or emitter electrode. In a JFET-structure, the channel region is typically formed by a portion of the drift region of the first conductivity type arranged between a gate region and a body region of the second conductivity type, and may be controlled by changing the width of a depletion layer formed between the gate region and the channel region.

In the context of the present specification, the terms "in ohmic contact", in resistive electric contact" and "in resistive electric connection" intend to describe that there is an ohmic current path between respective elements or portions of a semiconductor device at least when no voltages or only low probe voltages are applied to and/or across the semiconductor device. Likewise, the terms in low ohmic contact, "in low resistive electric contact" and "in low resistive electric connection" intend to describe that there is a low resistive ohmic current path between respective elements or portions of a semiconductor device at least when no voltages are applied to and/or across the semiconductor device. Within this specification the terms "in low ohmic contact", "in low resistive electric contact", "electrically coupled", and "in low resistive electric connection" are used synonymously. In some embodiments, the resistivity of a low resistive current path between respective elements or portions of a semiconductor device which is low when low voltages are applied to and/or across the semiconductor device, for example a probe voltage of less than one or a few volts, becomes high above a threshold voltage, for example due to depleting a semiconductor region forming at least a part of the current path.

In the context of the present specification, the term "MOS" (metal-oxide-semiconductor) should be understood as including the more general term "MIS" (metal-insulator-semiconductor). For example, the term MOSFET (metal-oxide-semiconductor field-effect transistor) should be understood to include FETs having a gate insulator that is not an oxide, i.e. the term MOSFET is used in the more general term meaning of IGFET (insulated-gate field-effect transistor) and MISFET (metal-insulator-semiconductor field-effect transistor), respectively.

In the context of the present specification, the term "gate electrode" intends to describe an electrode which is situated next to, and configured to form and/or control a channel region. The term "gate electrode" shall embrace an electrode or conductive region which is situated next to, and insulated from the body region by an insulating region forming a gate dielectric region and configured to form and/or control a channel region through the body region by charging to an appropriate voltage.

Typically, the gate electrode is implemented as trench-gate electrode, i.e. as a gate electrode which is arranged in a trench extending from the main surface into the semiconductor substrate or body.

A unit cell of an active area of a power field-effect semiconductor device may, in a horizontal cross-section, include a trench-gate electrode and a surrounding portion of a mesa when the trench-gate electrodes form a two-dimensional lattice, for example in the form of a checker board, when seen from above.

Alternatively, the unit cell of the active area of a power field-effect semiconductor device may, in a horizontal cross-section, include a trench-gate electrode and a respective portion of two adjoining mesas when seen from above. In these embodiments, trench-gate electrodes, mesas and unit cells may form respective one-dimensional lattices.

In the context of the present specification, the term "mesa" or "mesa region" intends to describe a semiconductor region which is, in a vertical cross-section, arranged next to one and typically between two adjacent trenches extending into the semiconductor substrate or body.

In the context of the present specification, the term "field electrode" intends to describe an electrode which is arranged next to a semiconductor region, typically the drift region, insulated from the semiconductor region and the semiconductor body, respectively, and configured to expand a depleted portion in the semiconductor region by charging to an appropriate voltage, typically a negative voltage with regard to the surrounding semiconductor region for an n-type semiconductor region. Typically, the field electrode, is formed by a conductive region, arranged in or on the semiconductor body and is insulated from the semiconductor body by an insulating region forming a field dielectric region. During the blocking mode, charges, typically negative charges for an n-type semiconductor region adjoining the insulating region, so that a portion of the semiconductor region is depleted by the charges.

The conductive regions for forming the gate electrode and the field electrode, respectively, may be made of a material with high enough electric conductivity so that the conductive region forms an equipotential region during device operation. For example, the conductive region may be made of a material with metallic or near-metallic electric conductivity such as a metal, for example wolfram, highly doped poly-silicon, a silicide or the like. Typically, the conductive region is in resistive electric connection with a gate metallization of the semiconductor device. The insulating region may be made of any suitable dielectric material such as silicon oxide, for example thermal silicon oxide, silicon nitride, siliconoxynitride or the like.

In the context of the present specification, the term "metallization" intends to describe a region or a layer with metallic or near metallic properties with respect to electric conductivity. A metallization may be in contact with a semiconductor region to form an electrode, a pad and/or a terminal of the semiconductor device. The metallization may be made of and/or comprise a metal such as Al, Ti, W, Cu and Co but may also be made of a material with metallic or near metallic properties with respect to electric conductivity such as highly doped n-type or p-type poly-Si, TiN or an electrically conductive silicide such as $TaSi_2$, $TiSi_2$, $PtSi$, $CoSi_2$, $WSi_2$ or the like. The metallization may also include different electrically conductive materials, for example a stack of those materials.

In the following, embodiments pertaining to semiconductor devices and manufacturing methods for forming semiconductor devices are explained mainly with reference to silicon (Si) semiconductor devices. Accordingly, a semiconductor region or layer is typically a monocrystalline Si-region or Si-layer.

Figure 1:
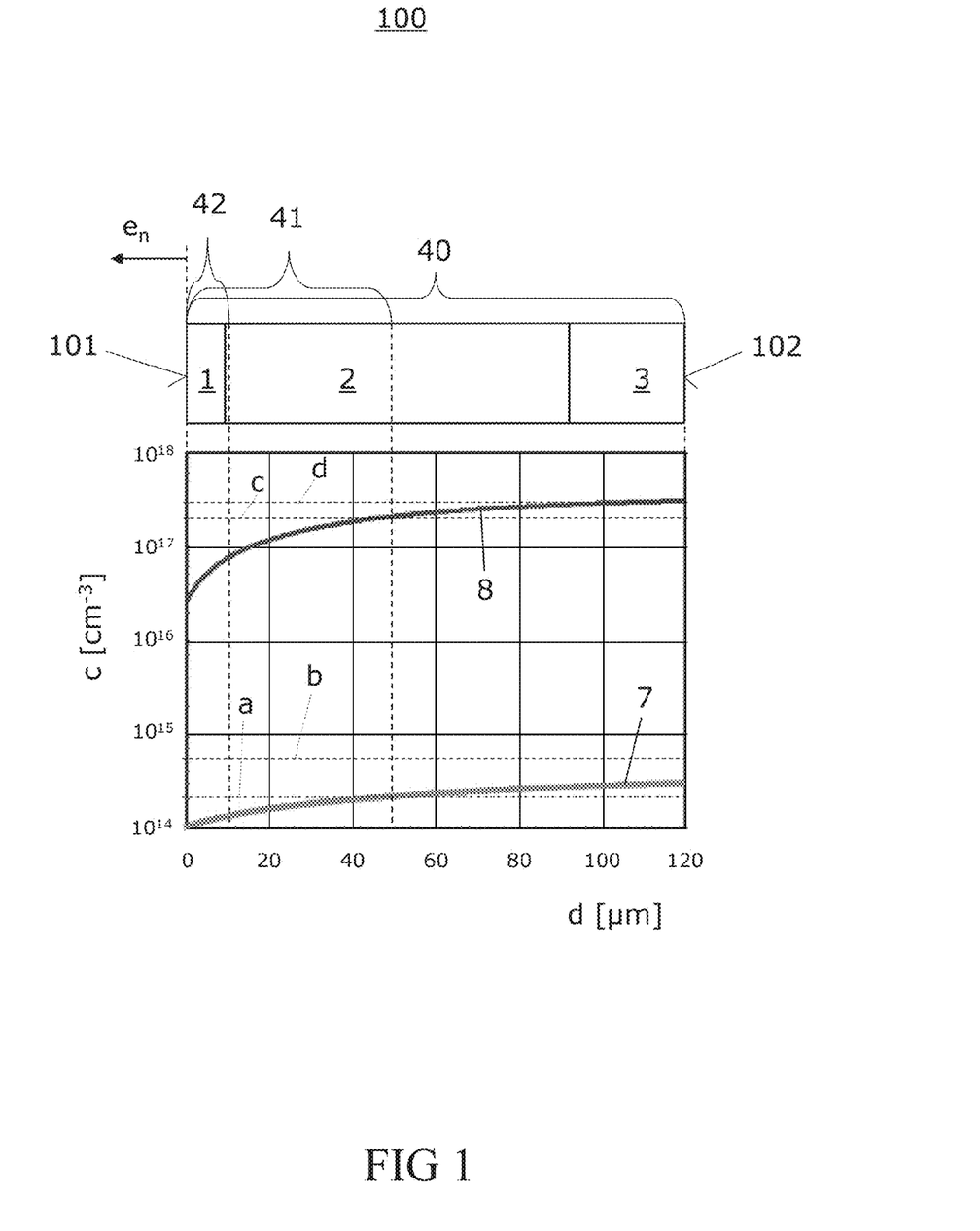
FIG. 1 illustrates a vertical cross-section through a semiconductor body and vertical concentration profiles of a semiconductor device according to embodiments.

With reference to FIG. 1, embodiments of a field-effect semiconductor device 100 and a method for forming the field-effect semiconductor device 100 are explained. FIG. 1 illustrates a vertical cross-section through a semiconductor body 40 of the semiconductor device 100 and a wafer for forming the semiconductor device 100, respectively. The semiconductor body 40 has a main surface 101 with a normal direction $e_n$ defining a vertical direction and a second surface 102 which is arranged opposite to the main surface 101. In the following the main surface 101 is also referred to as main horizontal surface. When the drawing represents a wafer 100, surface 102 represents a back surface of the wafer 100. Hence, reference numeral '100' in FIG. 1 represents a semiconductor device in some embodiments and the wafer used to form the semiconductor device in other embodiments. Note that the vertical extension of the semiconductor device 100 to be manufactured is typically smaller compared to the wafer used for manufacturing as the wafer is typically thinned at the back surface to form the second surface of the semiconductor device.

In the exemplary embodiment, only three Si-layers 1 to 3 are illustrated. Each of the three Si-layers 1 to 3 may include more than one semiconductor region. The second Si-layer 2 typically includes at least in a major portion an n-type drift region and an optional n-type field-stop region which has a higher maximum doping concentration than the drift region and is arranged between the drift region and the third Si-layer 3. The third Si-layer 3 extends to the second surface 102 and may—depending on whether the semiconductor device 100 may be operated a MOSFET or an IGBT—be formed by an n-type drain region or a p-type collector region both having a higher maximum doping concentration than the drift region and the optional field-stop region. In the first case, a drain metallization in ohmic contact with the collector region may be arranged on the second surface 102. In the second case, a collector metallization in ohmic contact with the collector region may be arranged on the second surface 102. When the semiconductor device 100 may be operated as an IGBT, the third Si-layer 3 may include one or more p-type collector regions and one or more higher doped n-type semiconductor regions in ohmic contact with the collector metallization to additionally integrate one or more free-wheeling diodes.

According to an embodiment, the semiconductor body 40 includes in a portion 42 which extends from the main surface 101 to a depth of, for example, about 5 μm or 10 μm, at least one trench-gate electrode, typically a plurality of trench-gate electrodes, which are arranged in respective vertical trenches extending from the main surface 101 through the first layer 1 and partially into the second layer 2 and drift region, respectively. Accordingly, one or more mesas are arranged in the semiconductor body 40, respectively. Each of the mesa(s) extends to main surface 101.

The first layer 1 typically includes one or more n-type source or emitter regions which have a higher maximum doping concentration than the drift region and typically extend to the main surface 101 and one or more p-type body regions which form respective first pn-junctions with the n-type source or emitter regions, and which form a respective second pn-junction the drift region.

As the one or more trench-gate electrodes extend across the first and second pn-junctions and are insulated from the semiconductor body 40 by respective gate dielectric regions, a plurality of field-effect structures are arranged in the portion 42 and next to the main surface 101, respectively.

A source or emitter metallization in ohmic contact with the one or more source regions and emitter regions, respectively, and typically also in ohmic contact with the one or more body regions may be arranged on the main surface 101. Furthermore, a gate metallization in ohmic contact with the one or more gate-electrodes may be arranged on the main surface 101.

According to an embodiment, a nitrogen concentration of the semiconductor body 40 is lower than about $2*10^{14}$ cm$^{-3}$, typically lower than about $10^{14}$ cm$^{-3}$ at least in a further portion 41 which extends from the main surface 101 to a desired depth of about 50 μm, about 100 μm, or even more, wherein the nitrogen concentration increases with a distance from the main surface 101 at least in the further portion 41. This is illustrated by curve 7 in the lower part of FIG. 1. Dashed lines a, b, c and d correspond to concentrations of $2*10^{14}$ cm$^{-3}$, $5*10^{14}$ cm$^{-3}$, $2*10^{17}$ cm$^{-3}$ and $3*10^{17}$ cm$^{-3}$, respectively. In the following, the further portion 41 of the semiconductor body 40 and the portion 42 of the semiconductor body 40 are also referred to as first portion 41 and second portion 42, respectively. Note that the second portion 42 is typically a sub-portion of the first portion 41.

The semiconductor device 100 is typically formed at wafer-level using a wafer 100 which is typically equal to or larger than 8", more typically equal or larger than 12" and cut from a drawn rod of a magnetic Czochralski silicon material doped with nitrogen at a concentration which is higher than about $3*10^{14}$ cm$^{-3}$, more typically higher than about $5*10^{14}$ cm$^{-3}$, even more typically higher than about $1*10^{15}$ cm$^{-3}$, and after partial out-diffusing of nitrogen prior to further processing. Due to the high nitrogen concentration in the silicon rod, only comparatively small COPs are formed in the silicon wafers.

Due to the low concentration of nitrogen after partial out-diffusing of nitrogen at least in the first portion 41, a detrimental effect of nitrogen atoms on n-type doping regions especially formed by proton implantation and subsequent annealing can be avoided. Proton induced n-type doping is often desired for the field-stop region and the drift region, in particular when power semiconductor devices are to be manufactured. Nitrogen incorporated into the silicon lattice as a substitutional atom has a deep energy level in the silicon band gap. Therefore it can compensate the donor atoms at least partially. This may result in a detrimental change of the n-type doping.

According to an embodiment, the method for producing the semiconductor device 100 includes a first process of providing a wafer 100 having a main surface 101 and a silicon layer 40 arranged at the main surface 101 and having a nitrogen concentration of at least about $3*10^{14}$ cm$^{-3}$, more typically higher than about $5*10^{14}$ cm$^{-3}$, even more typically higher than about $1*10^{15}$ cm$^{-3}$. Accordingly, a wafer 100 with reduced concentration and/or size of COPs is provided.

Thereafter, nitrogen is partially out-diffused, for example through the main surface 101 or through both the main surface 101 and the back surface 102 which is arranged opposite to the main surface 101, to reduce the nitrogen concentration at least close to the main surface 101. This is typically done in an oven process, for example in a temperature range from about 900° C. to about 1050° C. Partial out-diffusing of nitrogen in the oven may be done for several up to about 30 hours to achieve the desired out diffusion depth.

The nitrogen concentration after partially out-diffusing nitrogen is typically lower than about $2*10^{14}$ cm$^{-3}$, more typically lower than about $10^{14}$ cm$^{-3}$ at least at the main surface 101, typically at least in the first portion 41 which may extend from the main surface 101 to a desired depth of about 50 μm up to more than 100 μm. The first portion 41 may also substantially extend to a depth corresponding to an interface with the third Si-layer 3 to be formed or to a depth which corresponds to the final vertical extension of the semiconductor body 40 of the semiconductor device 100 to be manufactured. The final vertical extension typically depends among others on the type and the voltage class of the semiconductor devices 100 to be manufactured. For example, the final vertical extension of a 600V vertical IGBT and a 1200V vertical IGBT may be about 70 μm and about 110 μm to about 140 μm, respectively.

According to an embodiment, a diffusion barrier for nitrogen, for example a SiN-cap layer is formed at the back surface 102 of the wafer 100 prior to partially out-diffusing nitrogen. In this embodiment, nitrogen is partially out-diffused mainly through main surface 101. Accordingly, nitrogen concentration is typically higher close to the back surface 102 compared to out-diffusing nitrogen through the main surface 101 and the back surface 102. This typically increases mechanical stability and thus facilitates wafer handling.

Typically, the nitrogen concentration is, at least in the first portion 41, reduced by at least a factor of two, more typically by at least a factor of 5 and even more typically by at least a factor of 10, compared to the nitrogen concentration prior to out diffusing nitrogen.

The depth up to which the nitrogen concentration is reduced by at least a factor of two typically depends on the voltage class of the semiconductor devices 100 to be manufactured. In other words, the nitrogen concentration is, compared to the nitrogen concentration prior to out diffusing nitrogen, typically reduced by at least a factor of two, more typically by at least a factor of 5 and even more typically by at least a factor of 10 in a semiconductor layer extending from the main surface 101 to a depth of about 50 μm to about 100 μm or even more, for example 150 μm, depending on the voltage class.

After partially out-diffusing nitrogen, the nitrogen concentration of the wafer 100 may be higher than about $5*10^{14}$ cm$^{-3}$, or even higher than about $1\times10^{15}$ cm$^{-3}$ in deep regions which are spaced apart from the main surface 101, for example at least close to the back surface 102 when a cap layer is used to prevent out diffusion of nitrogen out of the back surface 102.

Typically, after partially out-diffusing nitrogen, the nitrogen concentration at the main surface 101 is lower than about 80%, more typical lower than about 50% of the nitrogen concentration at half thickness of the wafer 100 or at the back surface 102 when a cap layer on the back surface 102 is used during partially out-diffusing nitrogen.

According to an embodiment, the oven process is performed in an inert atmosphere, for example in an Ar-atmosphere. Performing the partial out-diffusion of nitrogen in an inert atmosphere also allows parallel partial out-diffusing of oxygen in an efficient manner. In particular for silicon-wafers with a diameter of 12" or larger, it is often difficult to achieve a desired oxygen concentration below $3*10^{17}$ cm$^{-3}$ more typically below $2*10^{17}$ cm$^{-3}$. Higher oxygen concentration may result in a significant lateral variation of n-type doping concentrations in the wafer 100 and between wafers and thus to a variation of the doping concentration of, for example, the drift region of different semiconductor devices 100 manufactured in parallel on a wafer and in a batch, respectively. This is due to the concentration variation of oxygen which typically acts as a thermal donor in silicon.

Partial out-diffusing of nitrogen may also be performed in an oxidizing and/or oxygen-containing atmosphere at temperatures below about 1050° C. This is because the maximum solubility of oxygen in silicon is below $2 \times 10^{17}$ cm$^{-3}$ at temperatures below about 1050° C.

The diffusion rate of oxygen is lower in silicon compared to nitrogen. Therefore, reducing the oxygen concentration below $2*10^{17}$ cm$^{-3}$ in regions further away from main surface 101 may take a longer time and/or a higher temperature. However, reducing the oxygen concentration below $2*10^{17}$ cm$^{-3}$, and more typically below $10^{17}$ cm$^{-3}$ is already particularly useful in the second portion 42 of the wafer 100, i.e. in a portion in which the insulated trench-gate electrode and/or an edge-termination structure are to be formed. This is because highest static and/or dynamic field-strengths are to be expected there during device operation. Consequently, thermal donors (oxygen) may have a particularly large impact in the second portion 42.

In the wafer and the semiconductor device 100 to be manufactured, the oxygen concentration typically drops by at least 10%, more typically at least about 20%, even more typically at least about 50% in the last 10 μm of the second portion 42 towards the main surface 101. For example, the oxygen concentration in silicon may drop by at least 10% in the last 5 μm towards the main surface 101. Typically, the targeted out diffusion of oxygen and nitrogen is realized by one annealing process.

Furthermore, reducing the oxygen concentration in the second portion 42 facilitates removing (dissolving) COPs in regions where the gate dielectric regions are to be formed or close to this region. Accordingly, the risk of thinning the gate dielectric regions due to the presence of COPs is reduced. Note that removing COPs is easier the lower the oxygen concentration in silicon is.

COPs may at least partly be removed prior to further processing by oxidizing the wafer 100 at least at the main surface 101, for example in a wet and oxygen rich atmosphere for a typical time period between about two and five hours. Typically, this oxidizing process is carried out in or in the presence of moist air. During this process, the inner oxide shell of the COPs is dissolved. Furthermore, interstitial silicon is formed at the border surface silicon/oxide during the oxidation of the main surface 101. By means of interstitial diffusion, the interstitial silicon moves quickly into the interior of the silicon where it fills vacancies and the interior of COPs.

Due to the presence of nitrogen in the silicon of wafer 100, only comparatively small COPs have to be removed. This can be achieved at comparatively low oxidation temperatures between about 950° C. and about 1050° C. At these temperatures, the risk of forming slip lines is lower compared to higher temperatures and oxygen does hardly diffuse into the silicon due its corresponding low solubility. Note that nitrogen is about 50 times as effective in suppressing formation and/or movement of slip lines in silicon compared to oxygen. Higher temperatures of up to about 1150° C. may also be used to oxidize the wafer 100. Still the risk of forming or increasing slip lines is reduced due to the hardening effect of nitrogen on silicon. The possible in-diffusion of oxygen into the first few micro-meters under this condition is also tolerable as it is better controllable compared to the oxygen doping during crystal growth.

Thereafter, the formed oxide layer may be removed from the main surface 101.

Thereafter, high energy protons may be implanted into the wafer 100 to form at least one n-type silicon layer 2, for example a drift region and/or a field stop-region which has a higher doping concentration than the drift region in the wafer 100. Note that several processes of proton implantations with different proton energies may be used. Note further that forming of n-type dopings with proton implantation and subsequent annealing is often desired for power semiconductor devices.

Due to partially out-diffusing nitrogen, the risk of separating electrically in-active nitrogen pairs in silicon and substituting silicon with nitrogen in the lattice is reduced during implanting high energy protons. Note that nitrogen as a lattice substitute may act as an unwanted impurity with a deep energy level resulting in an undesired at least partial compensation of n doping.

Thereafter, a field-effect structure may be formed next to the main surface 101. This typically includes: forming a pn-junction in the first portion 41; etching one or more vertical trench(es) per semiconductor device 100 to be manufactured from the main surface 101 partially into the drift region 2, typically by etching to a first depth of about 5 to 10 μm; insulating the side and bottom-walls of the one or more vertical trench(es) to form respective gate dielectric regions; and filling the one or more vertical trench(es) with a conductive material such as doped poly-silicon to form insulated gate electrodes in the one or more vertical trench(es). Prior to this, a field electrode may be formed in each of the one or more vertical trench(es). Furthermore, one or more edge-terminations structures may be formed close to the main surface 101.

Thereafter, a gate metallization and a source or collector metallization may be formed on the main surface 101, typically by deposition.

Thereafter, the wafer 100 may be suitably thinned at the back surface 102 to form a second surface onto which a drain or collector metallization may be deposited.

Thereafter, the wafer 100 may be cut into individual chips and semiconductor devices, respectively.

The nitrogen concentration of the silicon semiconductor body 40 of the formed semiconductor devices 100 may be higher than about $5*10^{14}$ cm$^{-3}$ or even higher than about $1*10^{15}$ cm$^{-3}$ at least in deep regions which are spaced apart from the main surface 101, for example close to the second surface.

The oxygen concentration is, in the second portion 42 of the silicon semiconductor body 40 which extends from the main surface 101 at least to about the first depth, below about $2*10^{17}$ cm$^{-3}$, more typically below about $10^{17}$ cm$^{-3}$. Typically, the oxygen concentration drops by at least 10% in the last 10 μm or 5 μm towards the main surface 101.

Typically, the concentration of crystal originated particles is at least in the second portion 42 lower than about $10^7$ cm$^{-3}$ and lower than about $10^9$ cm$^{-3}$ in the first portion 41.

According to an embodiment, the field-effect semiconductor device includes a semiconductor body 40. The semiconductor body 40 includes a main surface 101 and a silicon mesa extending to the main surface 101 and having a nitrogen concentration which is lower than about $2*10^{14}$ cm$^{-3}$ at least in a first portion 41 extending from the main surface 101 to a depth of about 50 μm, wherein the nitrogen concentration increases with a distance from the main surface 101 at least in the first portion 41. A field-effect structure which typically includes a plurality of trench-gate electrodes is arranged next to the main surface 101.

Figure 2:
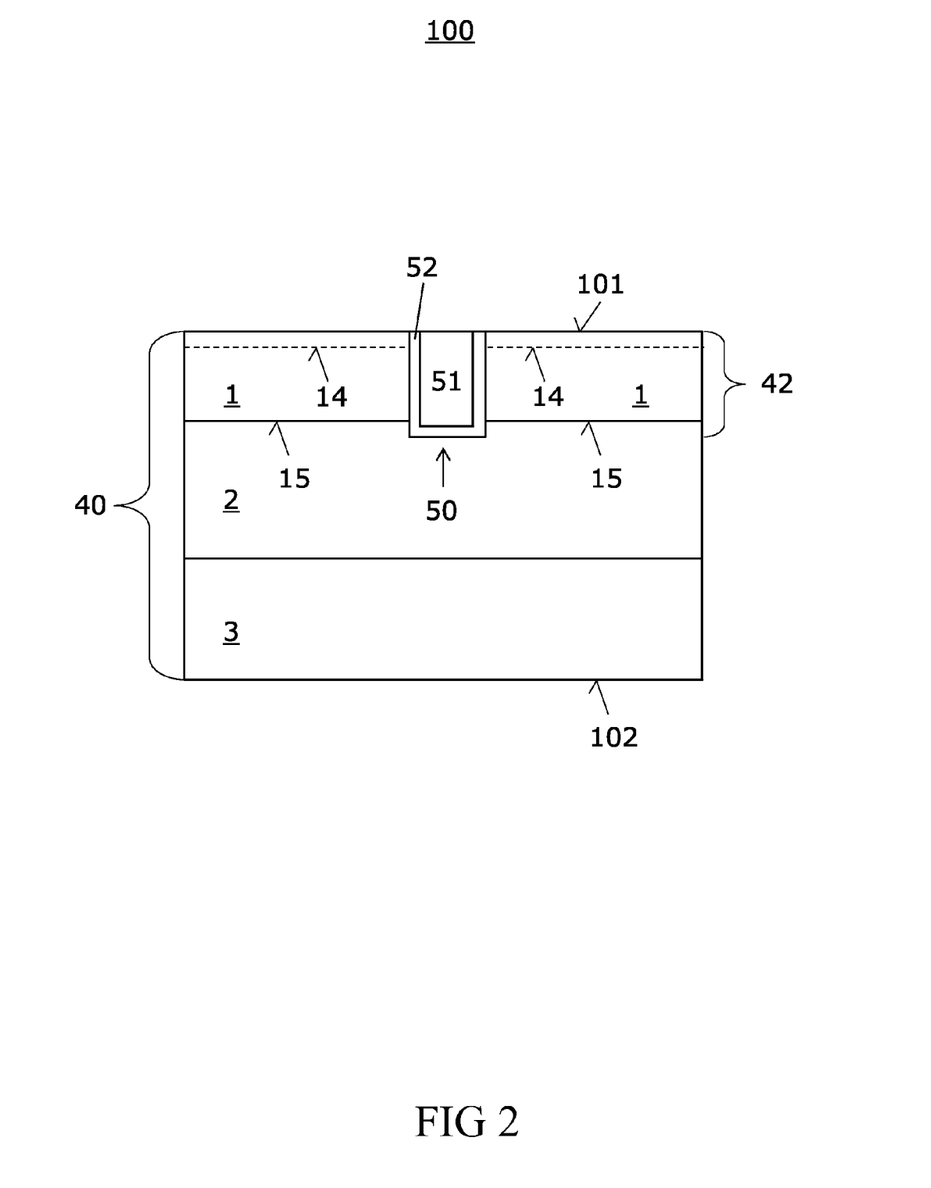
FIG. 2 illustrates a vertical cross-section through a semiconductor body according to another embodiment.

FIG. 2 shows another embodiment of the semiconductor device 100. According to this embodiment, the semiconductor device 100 includes a vertical trench 50, a trench-gate electrode 51, a gate dielectric region 52, a first pn-junction 14, and a second pn-junction 15.

Figure 3:
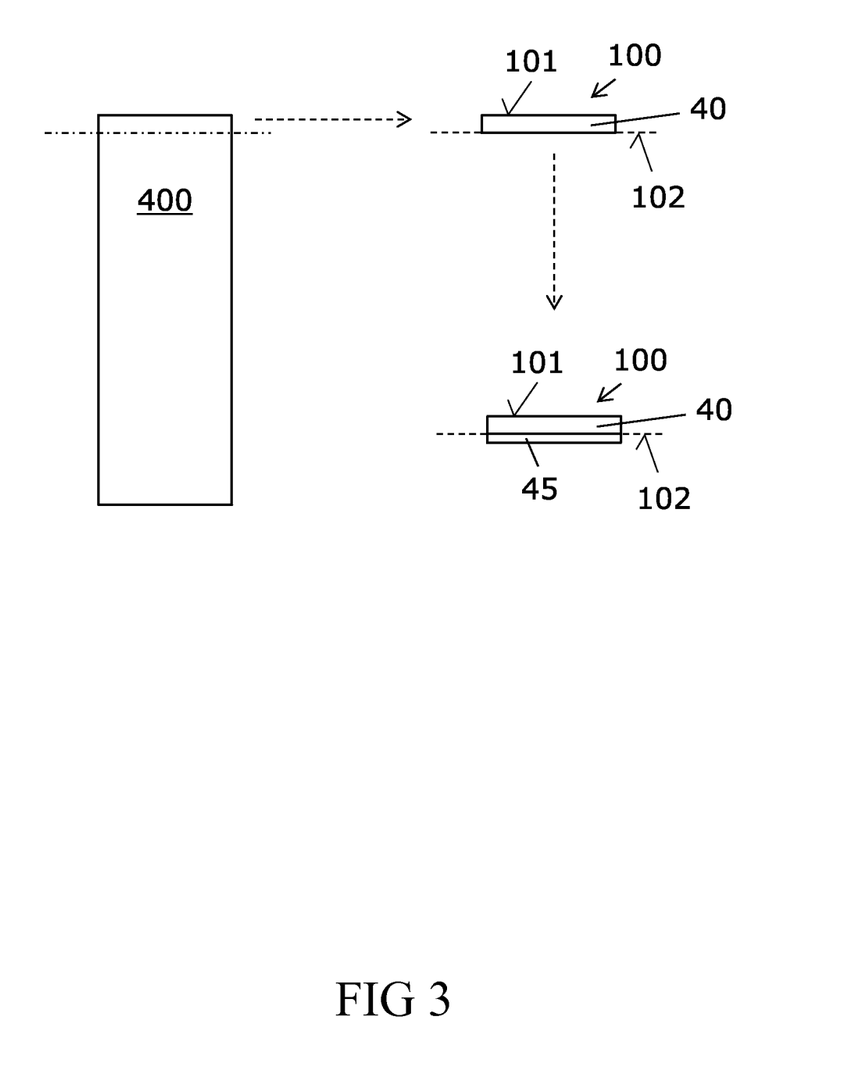
FIG. 3 illustrates a diffusion barrier for nitrogen and a dashed-dotted line running through a drawn rod, the dashed-dotted line referring to a cutting line.

In FIG. 3, the dashed-dotted line running through drawn rod 400 refers to a cutting line. A diffusion barrier 45 for nitrogen also is shown.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific figure may be combined with features of other figures, even in those cases in which this has not explicitly been mentioned. Such modifications to the inventive concept are intended to be covered by the appended claims.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method for producing a semiconductor device, comprising:
   providing a wafer comprising a main surface and a silicon layer arranged at the main surface and having a nitrogen concentration of at least about $3*10^{14}$ cm$^{-3}$;
   partially out-diffusing nitrogen to reduce the nitrogen concentration at least close to the main surface such that the nitrogen concentration of the silicon layer is reduced by at least a factor of two at least in a first portion extending from the main surface to a depth of about 50 μm and that an oxygen concentration of the silicon layer drops by at least 10% in the last 10 μm towards the main surface;
   oxidizing the wafer at least at the main surface after partially out-diffusing the nitrogen; and
   implanting protons to form at least one n-type silicon layer in the silicon layer.

2. The method of claim 1, wherein the nitrogen concentration prior to partially out-diffusing the nitrogen is higher than about $5*10^{14}$ cm$^{-3}$.

3. The method of claim 1, wherein the nitrogen concentration after partially out-diffusing the nitrogen is at the main surface lower than about $2*10^{14}$ cm$^{-3}$.

4. The method of claim 1, wherein the nitrogen concentration of the silicon layer after partially out-diffusing the nitrogen is lower than about $2*10^{14}$ cm$^{-3}$ at least in the first portion extending from the main surface to a depth of about 50 μm.

5. The method of claim 1, wherein the wafer has a size of at least 8".

6. The method of claim 1, wherein the wafer comprises a back surface which is arranged opposite to the main surface, the method further comprising forming at the back surface a diffusion barrier for nitrogen prior to partially out-diffusing the nitrogen.

7. The method of claim 1, wherein partially out-diffusing the nitrogen is performed such that an oxygen concentration of the silicon layer close to the main surface is below about $2*10^{17}$ cm$^{-3}$.

8. The method of claim 1, wherein partially out-diffusing the nitrogen is performed such that an oxygen concentration of the silicon layer drops by at least 10% in the last 5 μm towards the main surface.

9. The method of claim 1, wherein partially out-diffusing the nitrogen comprises an oven process.

10. The method of claim 1, wherein partially out-diffusing the nitrogen is performed in an inert atmosphere.

11. The method of claim 1, wherein partially out-diffusing the nitrogen is performed in an oxidizing atmosphere.

12. The method of claim 1, wherein partially out-diffusing the nitrogen is performed at a temperature in a range from about 900° C. to about 1050° C.

13. The method claim 1, wherein partially out-diffusing the nitrogen is performed at least for several hours.

14. The method of claim 1, wherein oxidizing the wafer at least at the main surface is performed at a temperature in a range from about 950° C. to about 1050° C.

15. The method of claim 1, further comprising at least one of:
   forming a pn-junction in the silicon layer;
   forming a field-effect structure next to the main surface;
   etching a vertical trench from the main surface;
   insulating at least a sidewall of the vertical trench; and
   thinning the wafer on a back surface which is opposite to the main surface.

16. The method of claim 1, wherein the wafer is cut from a drawn rod of a magnetic Czochralski silicon material.

17. The method of claim 1, wherein partially out-diffusing the nitrogen is performed such that the nitrogen concentration monotonically increases with a distance from the main surface after being partially out-diffused.

* * * * *

UNITED STATES PATENT AND TRADEMARK OFFICE
CERTIFICATE OF CORRECTION

PATENT NO. : 9,029,243 B2  
APPLICATION NO. : 13/646790  
DATED : May 12, 2015  
INVENTOR(S) : H. Schulze et al.

Page 1 of 1

It is certified that error appears in the above-identified patent and that said Letters Patent is hereby corrected as shown below:

Claims  
Column 12, line 35 (claim 13, line 1) please change "method claim" to -- method of claim --  
Column 12, line 38 (claim 14, line 2) please change "performed at" to -- performed in a wet atmosphere at --

Signed and Sealed this  
Second Day of February, 2016

Michelle K. Lee  
*Director of the United States Patent and Trademark Office*